(12) United States Patent
Xu et al.

(10) Patent No.: US 9,196,706 B2
(45) Date of Patent: Nov. 24, 2015

(54) METHOD FOR MANUFACTURING P-TYPE MOSFET

(71) Applicant: Institute of Microelectronics, Chinese Academy of Sciences, Beijing (CN)

(72) Inventors: Qiuxia Xu, Beijing (CN); Huilong Zhu, Poughkeepsie, NY (US); Tianchun Ye, Beijing (CN); Huajie Zhou, Beijing (CN); Gaobo Xu, Beijing (CN); Qingqing Liang, Lagrangeville, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/004,802

(22) PCT Filed: Dec. 7, 2012

(86) PCT No.: PCT/CN2012/086172
§ 371 (c)(1),
(2) Date: Sep. 12, 2013

(87) PCT Pub. No.: WO2014/082341
PCT Pub. Date: Jun. 5, 2014

(65) Prior Publication Data
US 2015/0295067 A1 Oct. 15, 2015

(30) Foreign Application Priority Data
Nov. 30, 2012 (CN) .......................... 2012 1 0506496

(51) Int. Cl.
*H01L 21/336* (2006.01)
*H01L 21/8234* (2006.01)
(Continued)

(52) U.S. Cl.
CPC .... *H01L 29/66545* (2013.01); *H01L 21/02181* (2013.01); *H01L 21/02189* (2013.01);
(Continued)

(58) Field of Classification Search
CPC ............ H01L 21/0228; H01L 21/7607; H01L 21/28079; H01L 21/02178; H01L 21/041; H01L 21/0238; H01L 21/762; H01L 21/242; H01L 21/046; H01L 21/265; H01L 21/0232; H01L 21/02255; H01L 21/31658; H01L 21/02642; H01L 27/1104; H01L 27/0922; H01L 27/1203; H01L 29/435; H01L 29/4941
USPC ......... 438/197, 199, 181, 208, 240, 270, 301, 438/311, 502, 503, 506, 507, 508, 509, 513, 438/680, 682, 683, 685, 688, 742, 743, 744, 438/753, 769; 257/E21.006, E21.042, 257/E21.043, E21.051, E21.077, E21.126, 257/E21.127, E21.135, E21.165, E21.17, 257/E21.247, E21.248, E21.267, E21.278, 257/E21.293, E21.296, E21.311, E21.32, 257/E21.4, E21.421, E21.593, E21.632
See application file for complete search history.

(56) References Cited

U.S. PATENT DOCUMENTS 7,704,844 B2 * 4/2010 Zhu et al. ...................... 438/302
8,299,540 B2 * 10/2012 Zhu et al. ...................... 257/370
(Continued)

*Primary Examiner* — David Nhu
(74) *Attorney, Agent, or Firm* — Kinney & Lange, P.A.

(57) ABSTRACT

Provided is a method for manufacturing a p-type MOSFET, including: forming a part of the MOSFET on a semiconductor substrate including source/drain regions, a replacement gate, and a gate spacer; removing the replacement gate stack of the MOSFET to form a gate opening; forming an interface oxide layer on the exposed surface of the semiconductor substrate; forming a high-K gate dielectric layer on the interface oxide layer; forming a first metal gate layer; implanting dopant ions into the first metal gate layer; and performing annealing to cause the dopant ions to diffuse and accumulate at an upper interface between the high K gate dielectric layer and the first metal gate layer and a lower interface between the high-K gate dielectric layer and the interface oxide layer, and also to generate electric dipoles by interfacial reaction at the lower interface between the high-K gate dielectric layer and the interface oxide layer.

14 Claims, 3 Drawing Sheets

(51) Int. Cl.
    *H01L 29/66*     (2006.01)
    *H01L 21/265*     (2006.01)
    *H01L 21/28*     (2006.01)
    *H01L 29/49*     (2006.01)
    *H01L 29/51*     (2006.01)
    *H01L 21/02*     (2006.01)
    *H01L 29/423*     (2006.01)

(52) U.S. Cl.
    CPC .... *H01L21/02192* (2013.01); *H01L 21/02194* (2013.01); *H01L 21/265* (2013.01); *H01L 21/28088* (2013.01); *H01L 21/28185* (2013.01); *H01L 29/42364* (2013.01); *H01L 29/4966* (2013.01); *H01L 29/517* (2013.01)

(56) References Cited

U.S. PATENT DOCUMENTS 8,853,751 B2 * 10/2014 Ando et al. .................. 257/288
2013/0034940 A1 * 2/2013 Ando et al. .................. 438/199

* cited by examiner

METHOD FOR MANUFACTURING P-TYPE MOSFET

CROSS-REFERENCE TO RELATED APPLICATION(S)

This application is a national stage application under 35 U.S.C. §371 of PCT/CN2012/086172, filed Dec. 7, 2012, not yet published, which claims priority to Chinese Application No. 201210506496.0, filed on Nov. 30, 2012, entitled "METHOD FOR MANUFACTURING P-TYPE MOSFET", which applications are incorporated by reference as if reproduced herein and made a part hereof in their entirety, and the benefit of priority of each of which is claimed herein.

TECHNICAL FIELD

The present disclosure relates to a technical field of semiconductor, and in particular, to a method for manufacturing a P-type MOSFET comprising a metal gate and a high-K gate dielectric layer.

BACKGROUND

With development of semiconductor technology, feature size of Metal Oxide Semiconductor Field Effect Transistors (MOSFETs) decreases continuously. The reduced size of the MOSFET may cause a current leakage problem. Physical thickness of a gate dielectric layer can be increased without changing Equivalent Oxide Thickness (EOT) by use of a high-K gate dielectric layer, so as to reduce tunneling leakage current. However, a conventional poly-silicon gate is incompatible with the high-K gate dielectric layer. Depletion effect of the polysilicon gate can be avoided by using a metal gate together with the high-K gate dielectric layer. Meanwhile, gate resistance can be reduced and boron penetration can be avoided, thereby increasing reliability of the device. Consequently, combination of the metal gate and the high-K gate dielectric layer is widely used in the MOSFET. However, the combination of the metal gate and the high-K gate dielectric layer still faces various challenges, such as thermal stability problem and interface state problem. In particular, it is difficult for the MOSFET comprising the metal gate and the high-K gate dielectric layer to achieve a properly low threshold voltage due to Fermi pinning effect.

In order to achieve a proper threshold voltage, a P-type MOSFET should have an effective work function near the top of valence band of Si (about 5.2 eV). For the P-type MOSFET, a desired threshold voltage can be achieved by selecting a proper combination of the metal gate and the high-K gate dielectric layer. However, it is difficult to achieve such a high effective work function merely by selection of materials.

SUMMARY OF THE INVENTION

The present disclosure provides an improved method for manufacturing a P-type MOSFET, in which an effective work function of a semiconductor device can be adjusted during manufacturing process.

According to the present disclosure, there is provided a method for manufacturing a P-type MOSFET, comprising: forming a part of the MOSFET on a semiconductor substrate, the part of the MOSFET comprising source/drain regions in the semiconductor substrate, a replacement gate stack between the source/drain regions above the semiconductor substrate, and a gate spacer surrounding the replacement gate stack; removing the replacement gate stack of the MOSFET to form a gate opening exposing a surface of the semiconductor substrate; forming an interface oxide layer on the exposed surface of the semiconductor; forming a high-K gate dielectric layer on the interface oxide layer in the gate opening; forming a first metal gate layer on the high-K gate dielectric layer; implanting dopant ions into the first metal gate layer; forming a second metal gate layer on the first metal gate layer to fill the gate opening; and performing annealing to cause the dopant ions to diffuse and accumulate at an upper interface between the high-K gate dielectric layer and the first metal gate layer and a lower interface between the high-K gate dielectric layer and the interface oxide layer, and also to generate electric dipoles by interfacial reaction at the lower interface between the high-K gate dielectric layer and the interface oxide layer.

According to the method, characteristics of the metal gate may be altered by the dopant ions accumulated at the upper interface of the high-K gate dielectric layer so that the effective work function of the MOSFET can be adjusted to advantage. On the other hand, electric dipoles having suitable polarities may be formed by interfacial reaction of the dopant ions accumulated at the lower interface of the high-K gate dielectric layer, so that the effective work function of the MOSFET can be further adjusted to advantage. Semiconductor devices manufactured by the method may have good stability and excellent performance in adjusting the effective work function of the metal gate.

BRIEF DESCRIPTION OF THE DRAWINGS

The present disclosure will be described in detail with reference to the drawings to enable better understanding of the present disclosure, in which.

DETAILED DESCRIPTION

Next, the present disclosure will be described in detail with reference to the drawings. In the following description, similar parts will be indicated by identical or similar reference signs whether they are illustrated in different embodiments or not. Throughout the drawings, respective parts are not drawn to scale for purpose of clarity.

Specific details of the present disclosure, such as structures, materials, sizes, processes and technologies of devices, are described below to facilitate understanding of the present disclosure. However, those skilled in the art will understand that the present disclosure can be implemented without these specific details. Unless otherwise specified, respective parts of a semiconductor device may comprise materials known to those skilled in the art or future materials having similar characteristics.

In the present disclosure, the term "semiconductor structure" refers to a semiconductor substrate and all layers or regions that have been formed on the semiconductor substrate after respective steps of manufacturing a semiconductor device. The term "source/drain region" refers to either a source region or a drain region of a MOSFET, which are indicated by the same reference sign. The term "P-type dopant" refers to a dopant for a P-type MOSFET that can increase effect work function.

A method for manufacturing a P-type MOSFET by a Gate-Last process will be described with reference to FIGS. 1-6 according to an embodiment of the present disclosure.

Figure 1:
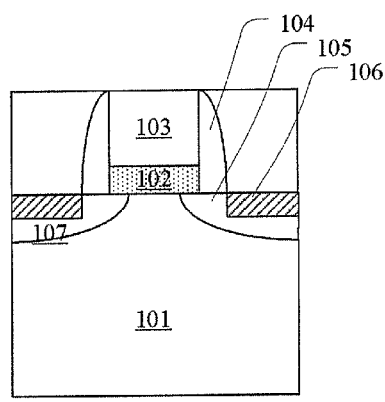
FIGS. 1-6 schematically show sectional views of semiconductor structures at respective phases of manufacturing a P-type MOSFET according to an embodiment of a method of the present disclosure.

FIG. 1 shows a semiconductor structure that has undergone part of the Gate-Last process. A semiconductor (e.g., silicon) substrate 101 comprises an active region of a P-type MOSFET defined by shallow trench isolation (not shown). In the active region of the P-type MOSFET, a replacement stack comprising a replacement gate dielectric (e.g., silicon oxide) layer 102 and a replacement gate conductive (e.g., polysilicon or α-Si) layer 103 is formed on the semiconductor substrate 101. The replacement gate stack is surrounded by a gate spacer 104 (e.g., a silicon nitride spacer). Source/drain regions 105 of the P-type MOFET are formed in the semiconductor substrate 101. The source-drain regions 105 are disposed at opposite sides of the replacement gate stack and may each comprise an extension region at least partially extending under the replacement gate dielectric layer 102. A silicide (e.g., nickel silicide or nickel platinum silicide) region 106 is formed on a surface of the source/drain region 105 to reduce series resistance and contact resistance of the source/drain region 105.

The semiconductor structure further comprises an interlayer dielectric (e.g., silicon nitride or silicon oxide) layer 107. A surface of the interlayer dielectric layer 107 is planarized by Chemical Mechanical Polishing (CMP) to expose a top surface of the replacement gate conductive layer 103. The interlayer dielectric layer 107 is used for protecting the active region and also as a hard mask in following steps.

Figure 2:
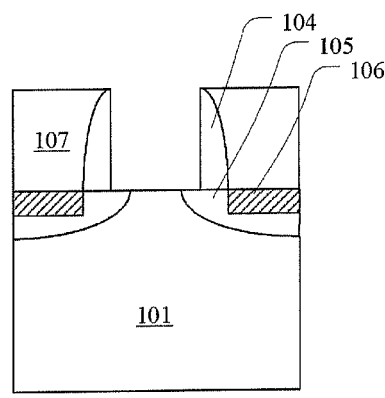

Next, the replacement gate conductive layer 103, and subsequently the replacement gate dielectric layer 102, is selectively removed using the interlayer 107 as a hard mask by dry etching (e.g., ion beam milling etching, plasma etching, reactive ion etching, or laser ablation) or wet etching using etchant, as shown in FIG. 2. The etching step forms a gate opening in the active region of the P-type MOSFET to expose a surface of the semiconductor substrate 101.

Figure 3:
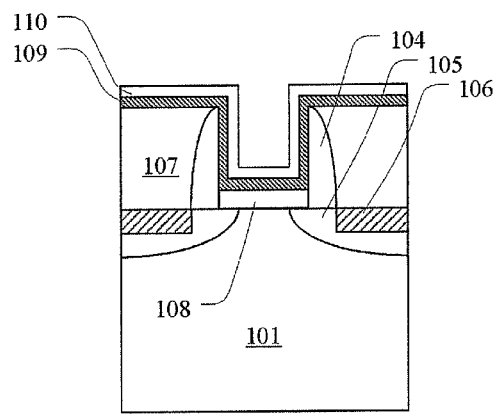

Then, an interface oxide (e.g., silicon oxide) layer 108 is formed on the exposed surface of the semiconductor substrate 101 by chemical oxidation or additional thermal oxidation. A high-K dielectric layer 109 and a first metal gate layer 110 are formed in this order on the surface of the semiconductor structure by a known deposition process, such as Atom Layer Deposition (ALD), Chemical Vapor Deposition (CVD), Metal Organic Chemical Vapor Deposition (MOCVD), Physical Vapor Deposition, or sputtering, as shown in FIG. 3. The high-K dielectric layer 109 and the first metal gate layer 110 are disposed on a bottom and sidewalls of the gate opening without filling the gate opening.

The high-K dielectric layer 109 may comprise a suitable material having a dielectric constant larger than that of $SiO_2$, such as any one selected from $ZrO_2$, ZrON, ZrSiON, HfZrO, HfZrON, HfON, $HfO_2$, HfAlO, HfAlON, HfSiO, HfSiON, HfLaO, HfLaON, and any combination thereof. The first metal gate layer 110 may comprise any material suitable for forming the metal gate, such as any one selected from TiN, TaN, MoN, WN, TaC, TaCN, and any combination thereof. In an embodiment, the high-K dielectric layer 109 is, e.g., an $HfO_2$ layer having a thickness of about 1.5-5 nm. The first metal gate layer 110 is, e.g., a TiN layer having a thicknesses of about 2-10 nm.

Preferably, post deposition annealing of the high-K dielectric layer 109 may be performed after forming the high-K dielectric layer 109 and before forming the first metal gate layer 110 to improve quality of the high-K dielectric layer. This helps to achieve a uniform thickness of the first metal gate layer 110, which is subsequently formed.

Figure 4:
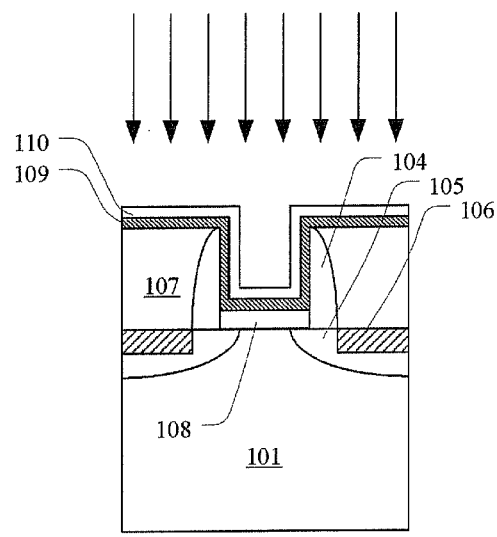

Next, P-type dopant ions are implanted into the first metal gate layer 110 of the active region of the P-type MOSFET, as shown in FIG. 4. The P-type dopant for the metal gate may be any one selected from In, B, BF2, Ru, W, Mo, Al, Ga, and Pt. Energy and dosage of the ion implantation may be controlled so that the implanted dopant ions are distributed only in the first metal gate layer 110 without entering the high-K dielectric layer 109. Meanwhile, the energy and dosage of the ion implantation may be controlled so that the first metal gate layer 110 may have a suitable doping concentration and doping depth to achieve a desired threshold voltage. In an embodiment, the energy of the ion implantation may be about 0.2 KeV-30 KeV and the dosage may be about 1E13-1E15 $cm^{-2}$.

Figure 5:
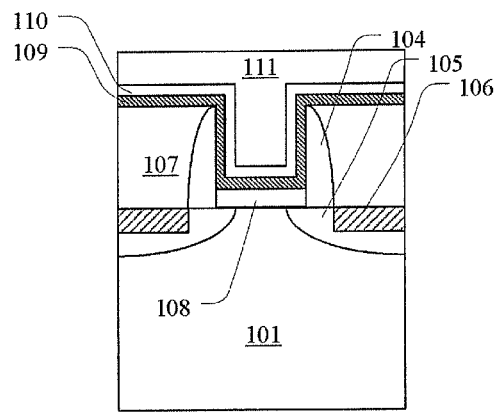

Then, a second metal gate layer 111 is formed covering the first metal gate layer 110, as shown in FIG. 5. The second metal gate layer 111 is thick enough so that it may at least fill the gate opening after CMP. The second metal gate layer 111 may comprise a low-resistance material suitable for forming the metal gate. Preferably, the second metal gate layer 111 may comprise any one of W, Ti, TiAl, Al, Mo, Ta, TiN, TaN, WN, and any combination thereof.

Figure 6:
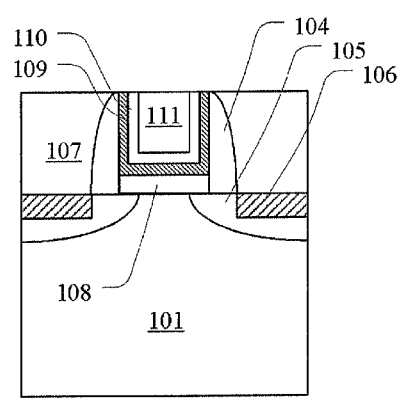

Next, a surface of the semiconductor structure is polished and planarized by, e.g., chemical mechanical polishing using the interlayer dielectric layer 107 as a stopping layer. In the planarization step, respective portions of the second metal gate layer 111, the first metal gate layer 110, and the high-K dielectric layer 109 outside the gate opening are removed, so that respective remaining portions of the second metal gate layer 111, the first metal gate layer 110, the high-K dielectric layer 109 and the interface oxide layer 108 inside the gate opening form the gate stack of the P-type MOSFET, as shown in FIG. 6.

After forming contacts and interconnections in a way well-known in the art, annealing is performed on the semiconductor structure in inert gas (e.g., N2) environment or weak reduction gas (e.g., a mixture of N2 and H2) environment. In an embodiment, the annealing is performed in a furnace at about 350° C.-450° C. for about 20-90 minutes. The annealing drives the implanted dopant ions to diffuse and accumulate at an upper interface and a lower interface of the high-K gate dielectric layer 109 and further generates electric dipoles by interfacial reaction at the lower interface of the high-K dielectric layer 109. Herein, the upper interface of the high-K gate dielectric layer 109 refers to the interface between the high-K gate dielectric layer 109 and the above first metal gate layer 110. The lower interface of the high-K gate dielectric layer 109 refers to the interface between the high-K gate dielectric layer 109 and the underneath oxide layer 108.

The annealing alters distribution of the ions. The dopant ions accumulated at the upper interface of the high-K gate dielectric layer 109 changes characteristics of the metal gate, so that the effective work function of the MOSFET can be adjusted to advantage. On the other hand, electric dipoles having suitable polarities may be formed by interfacial reaction of the dopant ions accumulated at the lower interface of the high-K gate dielectric layer 109, so that the effective work function of the MOSFET can be further adjusted to advantage.

The above description does not include all details of the MOSFET, such as formation of source/drain contacts, additional interlayer dielectric layers and conductive paths. Standard CMOS processes for forming the foregoing parts and their application in the MOSFET of the foregoing embodiments are well-known to those skilled in the art, and thus will not be explained in detail.

The foregoing description is only for illustrating and describing the present disclosure rather than exhausting or limiting the same. Therefore, the present disclosure is not limited to the described embodiments. Any variations or alterations obvious to those skilled in the art will fall in the protect scope of the present disclosure.

The invention claimed is:

1. A method for manufacturing a P-type MOSFET, the method comprising:
    forming a part of the MOSFET on a semiconductor substrate, the part of the MOSFET comprising source/drain regions in the semiconductor substrate, a replacement gate stack between the source/drain regions above the semiconductor substrate, and a gate spacer surrounding the replacement gate stack;
    removing the replacement gate stack of the MOSFET to form a gate opening exposing a surface of the semiconductor substrate;
    forming an interface oxide layer on the exposed surface of the semiconductor substrate;
    forming a high-K gate dielectric layer on the interface oxide layer in the gate opening;
    forming a first metal gate layer on the high-K gate dielectric layer;
    implanting dopant ions into the first metal gate layer;
    forming a second metal gate layer on the first metal gate layer to fill the gate opening; and
    performing annealing to cause the dopant ions to diffuse and accumulate at an upper interface between the high-K gate dielectric layer and the first metal gate layer and a lower interface between the high-K gate dielectric layer and the interface oxide layer, and also to generate electric dipoles by interfacial reaction at the lower interface between the high-K gate dielectric layer and the interface oxide layer.

2. The method according to claim 1, wherein the high-K gate dielectric layer comprise any one selected from $ZrO_2$, ZrON, ZrSiON, HfZrO, HfZrON, HfON, $HfO_2$, HfAlO, HfAlON, HfSiO, HfSiON, HfLaO, HfLaON, and any combination thereof.

3. The method according to claim 1, wherein the high-K gate dielectric layer has a thickness of about 1.5 nm-5 nm.

4. The method according to claim 1, wherein the high-K gate dielectric layer is formed by any one of atom layer deposition, physical vapor deposition, and metal organic chemical vapor deposition.

5. The method according to claim 4, further comprising performing additional annealing after forming the high-K gate dielectric layer to improve quality of the high-K gate dielectric layer.

6. The method according to claim 1, wherein the first metal gate layer comprises any one selected from TiN, TaN, MoN, WN, TaC, TaCN, and any combination thereof.

7. The method according to claim 1, wherein the first metal gate layer has a thickness of about 2 nm-10 nm.

8. The method according to claim 1, wherein the second metal gate layer comprises any one selected from W, Ti, TiAl, Al, Mo, Ta, TiN, TaN, WN, and any combination thereof.

9. The method according to claim 1, wherein in implanting the dopant ions into the first metal gate layer, energy and dosage of ion implantation is controlled according to a desired threshold voltage to cause the dopant ions to distribute only in the first metal gate layer.

10. The method according to claim 9, wherein the energy of the ion implantation is about 0.2 KeV-30 KeV.

11. The method according to claim 9, wherein the dosage of the ion implantation is about $1E13\ cm^{-2}$-$1E15\ cm^{-2}$.

12. The method according to claim 1, wherein dopant ions implanted into the first metal gate layer is capable of increasing effective work function.

13. The method according to claim 12, wherein the dopant is any one selected from In, B, $BF_2$, Ru, W, Mo, Al, Ga, and Pt.

14. The method according to claim 1, wherein the annealing is performed in inert gas environment or weak reduction gas environment at about 350° C.-450° C. for about 20-90 minutes.

* * * * *